US012651884B2

(12) United States Patent
Kanskar

(10) Patent No.: US 12,651,884 B2
(45) Date of Patent: Jun. 9, 2026

(54) INTEGRATED THERMAL MANAGEMENT OF FIBER COUPLED DIODE LASER PACKAGING

(71) Applicant: NLIGHT, INC., Camas, WA (US)

(72) Inventor: Manoj Kanskar, Camas, WA (US)

(73) Assignee: nLIGHT, Inc., Camas, WA (US)

( * ) Notice: Subject to any disclaimer, the term of this patent is extended or adjusted under 35 U.S.C. 154(b) by 809 days.

(21) Appl. No.: 17/419,000

(22) PCT Filed: Dec. 20, 2019

(86) PCT No.: PCT/US2019/068143
§ 371 (c)(1),
(2) Date: Jun. 28, 2021

(87) PCT Pub. No.: WO2020/142291
PCT Pub. Date: Jul. 9, 2020

(65) Prior Publication Data
US 2022/0123519 A1 Apr. 21, 2022

Related U.S. Application Data

(60) Provisional application No. 62/787,181, filed on Dec. 31, 2018.

(51) Int. Cl.
*H01S 5/024* (2006.01)
*H01S 5/02251* (2021.01)
*H01S 5/40* (2006.01)

(52) U.S. Cl.
CPC ...... *H01S 5/02251* (2021.01); *H01S 5/02423* (2013.01); *H01S 5/4025* (2013.01)

(58) Field of Classification Search
CPC .................................................. H01S 5/02423
See application file for complete search history.

(56) References Cited

U.S. PATENT DOCUMENTS 6,354,370 B1 3/2002 Miller et al.
2003/0086454 A1* 5/2003 Nagano ............... H01S 5/02423
372/35

(Continued)

FOREIGN PATENT DOCUMENTS

EP 3203512 A1 * 8/2017 ........... H01L 23/427
WO WO 2010/090766 A1 8/2010

(Continued)

OTHER PUBLICATIONS https://www.merriam-webster.com/dictionary/lid (Year: 2024).*

(Continued)

*Primary Examiner* — Minsun O Harvey
*Assistant Examiner* — Stephen Sutton Kotter
(74) *Attorney, Agent, or Firm* — Wiley Rein LLP

(57) ABSTRACT

A laser diode package, comprising a housing having a metal base portion, an integrated heat spreader formed within the base, the integrated heat spreader comprising a first phase-change material (PCM) and configured to dissipate heat via phase-change cooling. A heat source may be disposed on a top surface of the base, the heat source may be thermally coupled to the integrated heat spreader so as to dissipate heat away from the heat source via phase-change cooling.

12 Claims, 16 Drawing Sheets

(56) References Cited

U.S. PATENT DOCUMENTS

| | | | | |
|---|---|---|---|---|
| 2011/0286482 A1* | 11/2011 | Deri | ................... | H01S 5/02469 |
| | | | | 372/36 |
| 2013/0044776 A1* | 2/2013 | Schlie | ................ | H01S 5/02469 |
| | | | | 156/60 |
| 2016/0315445 A1* | 10/2016 | Bandhauer | ............. | H01S 5/024 |
| 2018/0306524 A1* | 10/2018 | Horovitz | ............ | F28D 20/0056 |
| 2019/0081453 A1* | 3/2019 | Meehan | ................ | H01L 25/167 |

FOREIGN PATENT DOCUMENTS

| | | | |
|---|---|---|---|
| WO | WO 2017/068476 A1 | 4/2017 |
| WO | WO 2020/142291 A1 | 7/2020 |

OTHER PUBLICATIONS https://celsiainc.com/technology/vapor-chamber/#:~:text=In%
20conclusion%2C%20vapor%20chambers%20are,%2C%20and%
2For%20low%20airflow. (Year: 2024).*
RU Patent Office; International Search Report; PCT/US2019/
068143 dated Mar. 12, 2020; 2 Pages.
RU Patent Office; International Written Opinion; PCT/US2019/
068143 dated Mar. 12, 2020; 2 Pages.

* cited by examiner

Detail A

INTEGRATED THERMAL MANAGEMENT OF FIBER COUPLED DIODE LASER PACKAGING

RELATED APPLICATIONS

This application is a US national phase application, which claims priority to PCT Application No. PCT/US2019/068143, filed Dec. 20, 2019, which claims priority to U.S. Provisional Application No. 62/787,181, filed Dec. 31, 2018, which are incorporated herein by reference in their entireties.

FIELD

The disclosure pertains to laser diode packages and laser diode package thermal management.

BACKGROUND

Modern industrial fiber lasers use semiconductor devices to provide energy directly to manufacturing targets or as pump sources for solid state lasers. However, laser diodes are generally assembled in protective packages to protect the device from damage due to thermal and mechanical stress, corrosion, contamination, etc. Semiconductor laser packages may be passively cooled or actively cooled using various heat dissipation components such as heat dissipation layers, heat spreaders, and/or heat sinks.

However, many applications for laser diode packages may have extreme size, weight, and power requirements that generally render laser diode packages, or even laser diodes, unsuitable for the application. Particularly, approaches that might address such requirements stand in direct tension with laser diode and laser diode package reliability and power capabilities. Therefore, a need remains for laser diode packages with improved size, weight, and power characteristics.

SUMMARY

Disclosed herein are examples of a laser diode package, comprising one or more of: a housing having a metal base portion, an integrated heat spreader formed within the base, the integrated heat spreader comprising a first phase-change material (PCM), a lid, and/or a heat source. In some examples, the first PCM is configured to dissipate heat via phase-change cooling. The heat source may be disposed on a top surface of the base, the heat source may be thermally coupled to the integrated heat spreader so as to dissipate heat away from the heat source via phase-change cooling. The first PCM may be water, alcohol, acetone, or the like or any combinations thereof. The heat source may be one or more laser diodes.

In some examples, the integrated heat spreader may be a vapor chamber or one or more heat pipes. The heat pipes may be arranged lengthwise across a width of the base portion, wherein respective fill tube ends alternate with vapor cavity ends and/or wherein one or more heat pipes are bent. In some examples, one or more heat pipes include a PCM comprising at least one of acetone, ammonia, ethane, methanol, methylamine, pentane, and propylene.

In some examples, the lid may be fabricated to couple to the metal base portion and a heatsink may be coupled to a top surface of the lid. The heatsink may comprise fins and/or a second PCM. The second PCM may be paraffin or other suitable PCM known to those of skill in the art.

The foregoing and other objects, features, and advantages will become more apparent from the following detailed description, which proceeds with reference to the accompanying figures which may not be drawn to scale.

BRIEF DESCRIPTION OF THE DRAWINGS

The accompanying drawings, wherein like reference numerals represent like elements, are incorporated in and constitute a part of this specification and, together with the description, explain the advantages and principles of the presently disclosed technology. In the drawings.

DETAILED DESCRIPTION

Figure 1A:
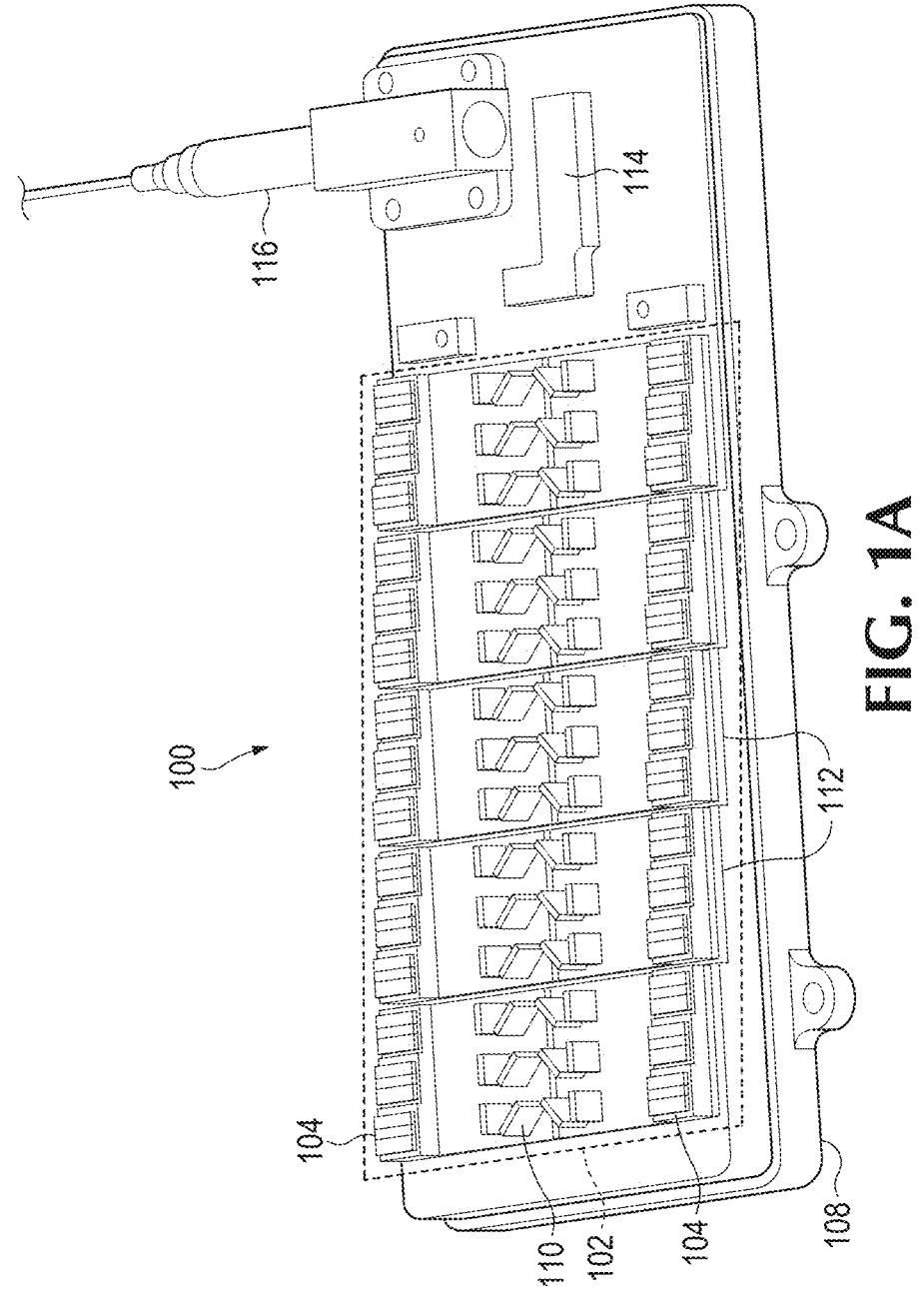
FIG. 1A illustrates an example of a conventional laser diode package.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items. The systems, apparatus, and methods described herein should not be construed as limiting in any way. Instead, the present disclosure is directed toward all novel and non-obvious features and aspects of the various disclosed embodiments, alone and in various combinations and sub-combinations with one another.

The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation. Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus.

Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art. In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections. Examples are described with reference to directions indicated as "above," "below," "upper," "lower," and the like. These terms are used for convenient description, but do not imply any particular spatial orientation. For the sake of simplicity and readability, in the drawings single elements are labeled. Where there is a plurality of identical elements, representative example elements will be labeled rather than labeling each of the plurality of elements.

Most fiber-coupled laser diode pumps have been developed for large volume industrial applications where the primary metric is price-per-bright-watts and reliability. Lasers that have been optimized for the industrial market do not readily meet defense requirements for low size, weight, and high power (so called "low SWaP"), efficiency, and ruggedness. Specifically, industrial diode lasers are approximately ≥1 kg/kW and volumes are greater than two times what would be acceptable for military high energy laser (HEL) applications. Furthermore, industrial diode lasers have approximately 50% electrical-to-optical power conversion efficiency (PCE); whereas, HEL applications require PCE≥55%. Industrial fiber-coupled laser diodes are either conductively cooled and therefore need to be mounted on a cooling plate to remove the heat; or, they may be cooled using some micro or macro-channels in thermal contact with the diode laser heat source. In such cases, external high-pressure coolant circulating pumps have to be used. They may even be directly two-phase cooled and will require a close-loop vapor compression system and a circulating pump to keep the diodes at the nominal operating temperatures. For all these cases, there is always an overhead thermal management system (TMS) that consumes more power and occupies high volume and mass.

FIG. 1A illustrates an example of a conventional laser diode package 100 that typically requires a TMS. The laser diode package 100 (with lid omitted) is a conductively-cooled industrial diode laser package that includes an optical assembly 102 having thirty single-emitter diode lasers 104 arranged in two groups on a conductive base 108 with stair-step blocks 112. During operation, laser beams emitted from laser diodes 104 are individually collimated in the fast axis and slow axis with respective fast axis collimators and slow axis collimators and are coupled into an output optical fiber 116 using a focusing objective 114. The laser diodes 104 typically generate significant amounts of heat that is dissipated through conductive base 108.

Figure 1B:
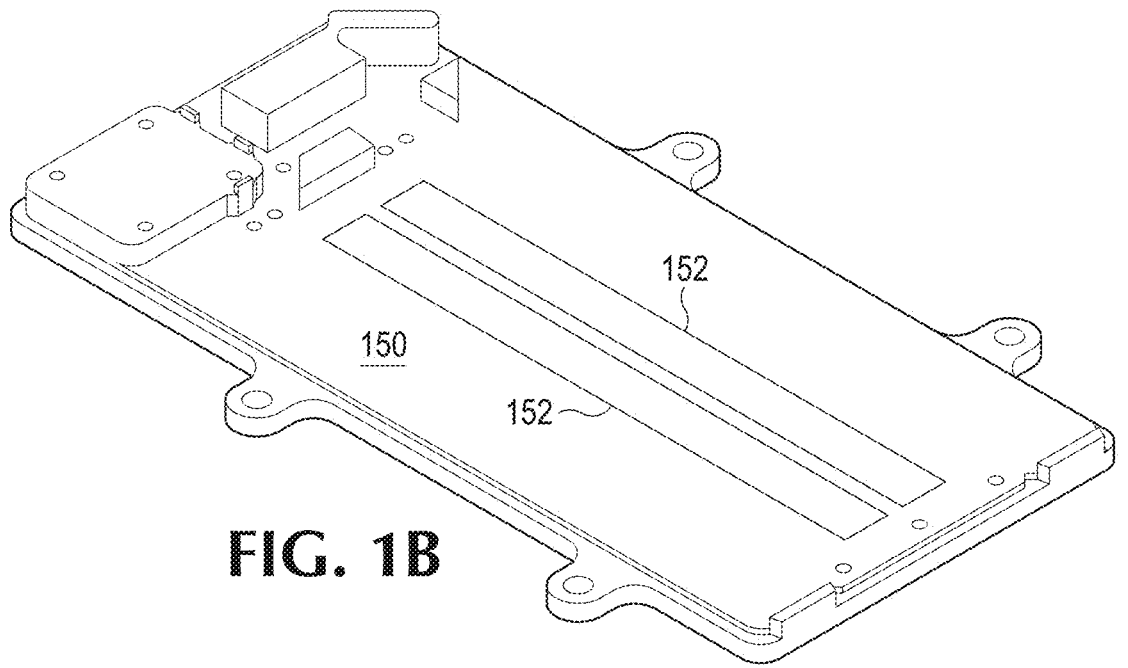
FIG. 1B illustrates an example of a conventional laser diode package base having two rectangular heat sources.

FIG. 1B illustrates an example of a conventional laser diode package conductive base 150 with two rectangular heat sources 152 generated by laser diode arrays residing on a top surface of the base 150, similar to that shown in FIG. 1A; however, in FIG. 1A the laser diodes 104 are disposed on the perimeter of the conductive base 108 whereas the rectangular heat sources 152 generated were generated by laser diodes disposed down the center of base 150.

Some conductively cooled industrial fiber laser applications may have lower than continuous wave (CW) operation (i.e. low duty cycle operation laser diodes). In such cases, there is on time and off time. If the heat generated during the on time can be effectively spread, then it may be dissipated using an integrated thermal management system incorporating a phase-change material. In such a case, an external TMS may not be needed thus reducing the SWaP of the laser system. What is needed is low-cost and low SWaP fiber-coupled diode laser packaging with integrated thermal management.

As will be further described below, in an example, an assembly comprising a low-cost and low SWaP fiber-coupled diode pump module with integrated heat spreaders may comprise: a thermal a heat spreader base, a graphite thermal interface material, a phase-change material base and fin-appendages which are heat sunk to the phase-change material (PCM).

Figure 2A:
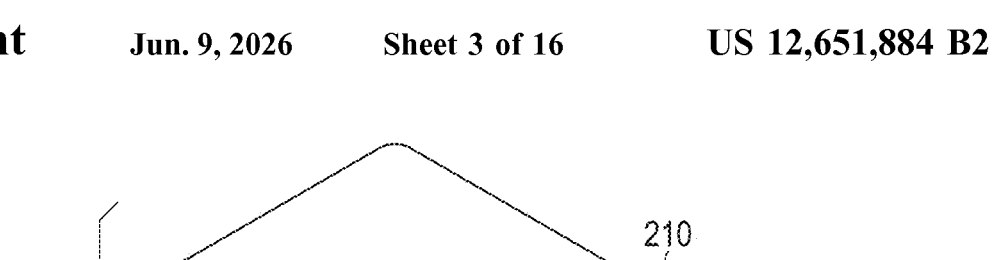
FIG. 2A is an exploded view of an example low SWaP fiber-coupled diode laser package with integrated thermal management.

FIG. 2A is an exploded view of an example low SWaP fiber-coupled diode laser package 200 with lid 210 side up (201 shows lid 210 side down) with integrated thermal management assembly 202. Package 200 includes a base portion 204. Base portion 204 may be made of a thermally conductive material such as, aluminum (Al), AlBeMet (Be and Al matrix), copper (Cu), silver (Ag), gold (Au), platinum (Pt), doped silicon (Si), graphite or the like or any combinations thereof. Lighter materials may be preferred for low SWaP applications.

In an example, integrated thermal management assembly 202 comprises a vapor chamber 208 including a PCM selected to enable heat transfer across base 204. Lid 210 may be bonded to base 204 to form the cavity 222 portion of vapor chamber 208 where the PCM in a vacuum transfers the heat generated by laser diodes 214 disposed on surface 216 to a cooled surface 218. Laser diodes 214 are thermally coupled to the PCM through base 204. The PCM may comprise any of a variety of PCM's known to those of skill in the art such as water, ammonia, alcohol, acetone, or the like, or any combinations thereof.

A wick 212 is formed on an inner surface 206 of lid 210 and vapor chamber 208 which transfers the PCM back to the heat source where it boils. Wick 224 is disposed on the inner surface of base 204. Posts 220 in the base 204 provide structural support to the cavernous housing. The major advantage of this design is that the entire bottom surface of the vapor chamber 208 may be nearly isothermal.

Figure 2B:
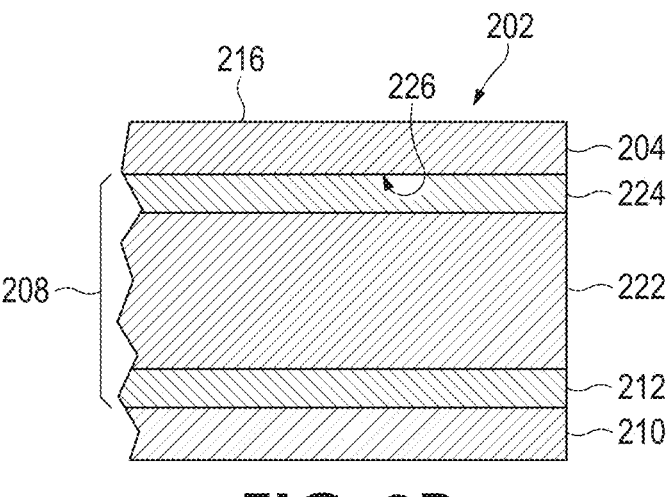
FIG. 2B illustrates a cutaway side view of an example integrated thermal management assembly in a low SWaP fiber-coupled diode laser package.

FIG. 2B illustrates a cutaway side view of an example integrated thermal management assembly 202 in a low SWaP fiber-coupled diode laser package 200. Assembly 202 includes a vapor chamber 208 disposed between base 204, and lid 210. The vapor chamber 208 comprises base wick 224, cavity 222, and lid wick 212. The heat has to pass through the base 204 and base wick 224 via base inner surface 226 where it heats to boiling the PCM causing a phase change from liquid to vapor. The PCM vapor then travels through vapor space cavity 222 and condenses on the lid wick 212 and other similar surfaces that are cooler than where the heat is locally deposited. The heat then conducts through the lid wick 212 and lid 210 to the bottom surface of the vapor chamber 208.

Figure 2C:
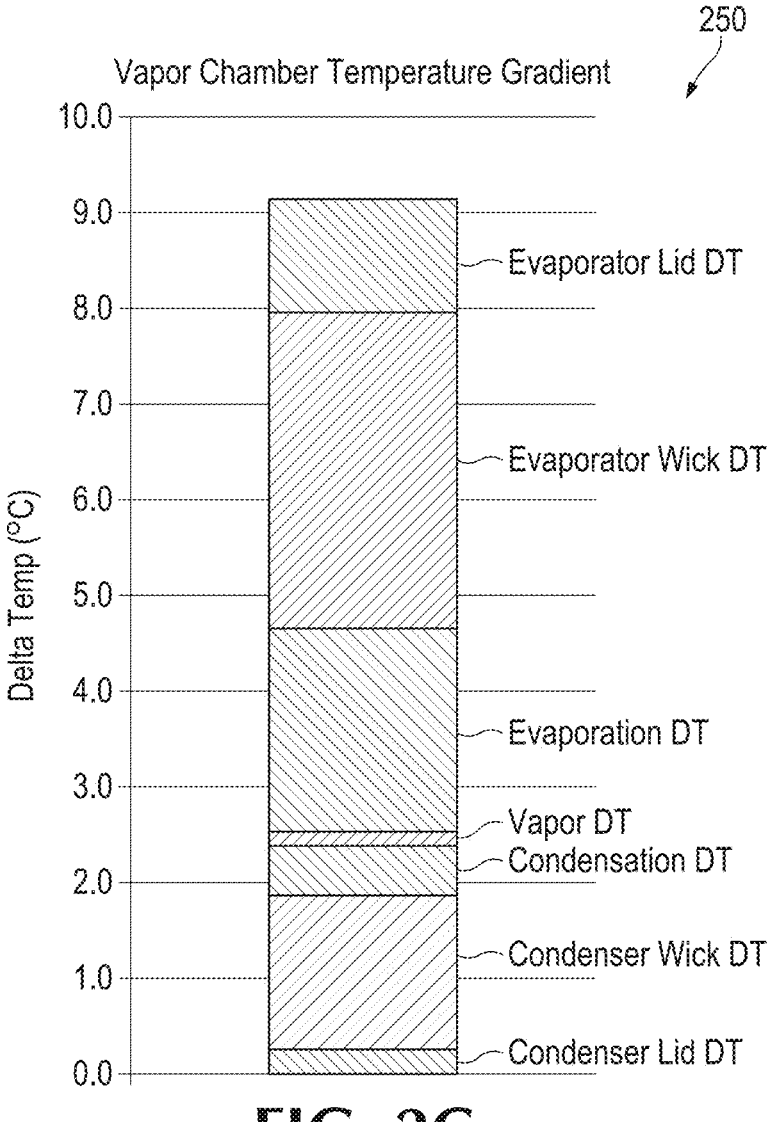
FIG. 2C is a graph showing a temperature gradient of an example integrated thermal management assembly.

FIG. 2C is a graph showing an integrated thermal management assembly 202 temperature gradient. The temperature stack up of the layers described with reference to FIG. 2B is summarized in graph 250. The estimated delta temperature (DT) is ~9° C. through the vapor chamber. Assuming the hottest spot is about 45° C., the entire bottom surface of the vapor chamber would be about 36° C. Therefore, vapor chamber 208 may be nearly isothermal.

Figure 2D:
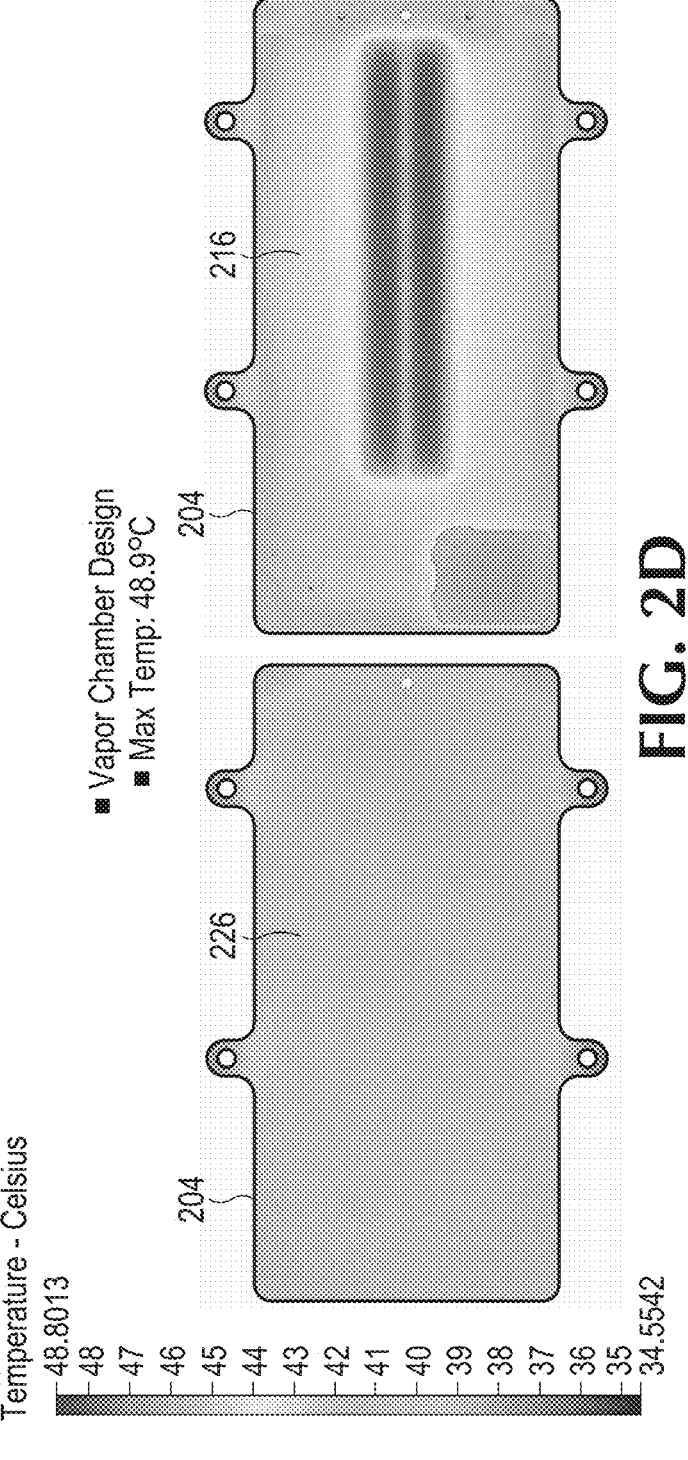
FIG. 2D illustrates a thermal simulation of an example integrated thermal management assembly.

FIG. 2D illustrates a thermal simulation of an example integrated thermal management assembly 202. The vapor chamber 208 geometry was input into a finite element analysis (FEA) simulation to determine the spreading and overall temperatures of the assembly 202 (FIG. 2A). 250 W and 70 W loads were applied to the base 204. A heat transfer coefficient of 6500 W/m²-K was used with a reference temperature of 25° C. A Graftech HT-2410 was assumed thermal interface material (TIM). The simulation shows that heat generated by laser diodes 214 on top side 216 of base 204 is efficiently dissipated through inner surface 226 by vapor chamber 208 such that heat is drawn to lid 210 from top side 216 and spread substantially evenly across base 204.

Figures 2E, 2F:
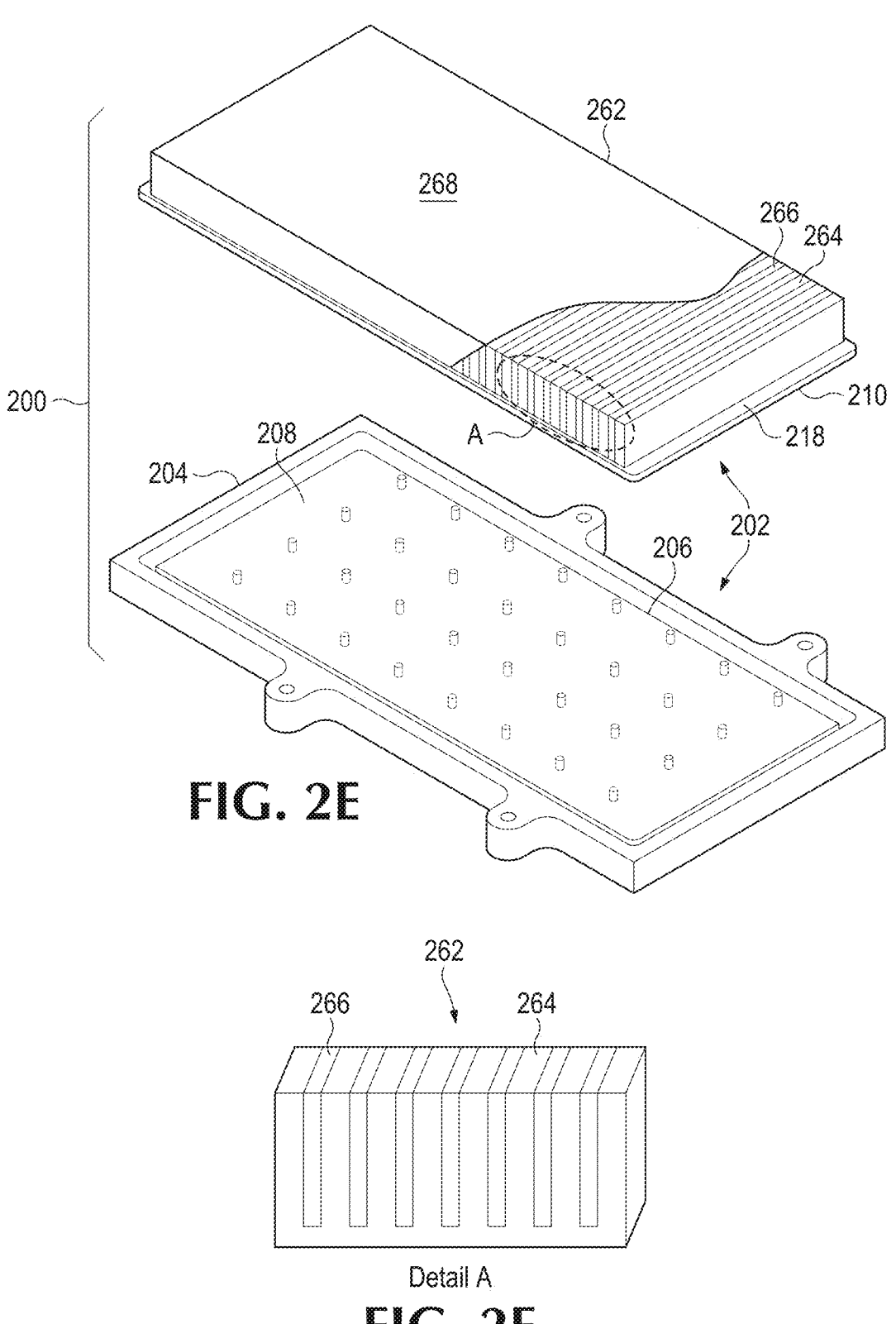
FIG. 2E is an exploded and partial cutaway view of an example low SWaP fiber-coupled diode laser package with integrated thermal management assembly including a heat sink on a cooled surface.
FIG. 2F is a perspective view of detail A of a PCM heat sink having fins and a PCM disposed between the fins.

FIG. 2E is an exploded and partial cutaway view of an example low SWaP fiber-coupled diode laser package 200 with integrated thermal management assembly 202 having a heatsink 262 coupled to cooled surface 218 of lid 210. Package 200 is described above with respect to FIG. 2A. In a further example, lid 210 may be thermally coupled to a heatsink 262 so as to dissipate heat generated by laser diodes 214 on base 204 and transferred to cooled surface 218 of lid 210. Heatsink 262 may comprise any of a variety of materials, such as, Al, Cu, Ag, Au, Pt, doped silicon (Si), graphite or the like or any combinations thereof. Heatsink 262 may comprise any of a variety of passive or active heatsinks known to those of skill in the art such as a finned heatsink, fan and/or cooling plate, or the like or any combinations thereof. A PCM 266 may be interleaved between fins 264 and enclosed in outer shell 268. In FIG. 2E, shell 268 is shown partially cutaway to reveal fins 264 and PCM 266 contained within shell 268. This arrangement enables PCM 266 to transition from a solid state to a liquid state during cooling without leaking. Shell 268 may confine PCM 266 to the space in-between fins 264. Alternatively, integrated thermal management assembly 202 may be arranged without shell 268. In such an arrangement, at least a portion of fins 264 (or other type of heatsink 262) may be submerged in an uncontained PCM 266, heat may be effectively dissipated by phase change of PCM 266 as long as heatsink 262 is thermally coupled to PCM 266. In a PCM heat sink, the heat travels up the fins before spreading into the paraffin. The PCM 266 may comprise any of a variety of PCM's known to those of skill in the art such as paraffin (paraffin has a very low thermal conductivity (<1 W/m-K) compared to aluminum (~200 W/m-K). Adjusting the fin 264 materials, pitch, thickness, and PCM material can all impact the performance of heat sink 262.

FIG. 2F is a perspective view of detail A showing more clearly heatsink 262 having fins 264 and PCM 266.

Figure 2G:
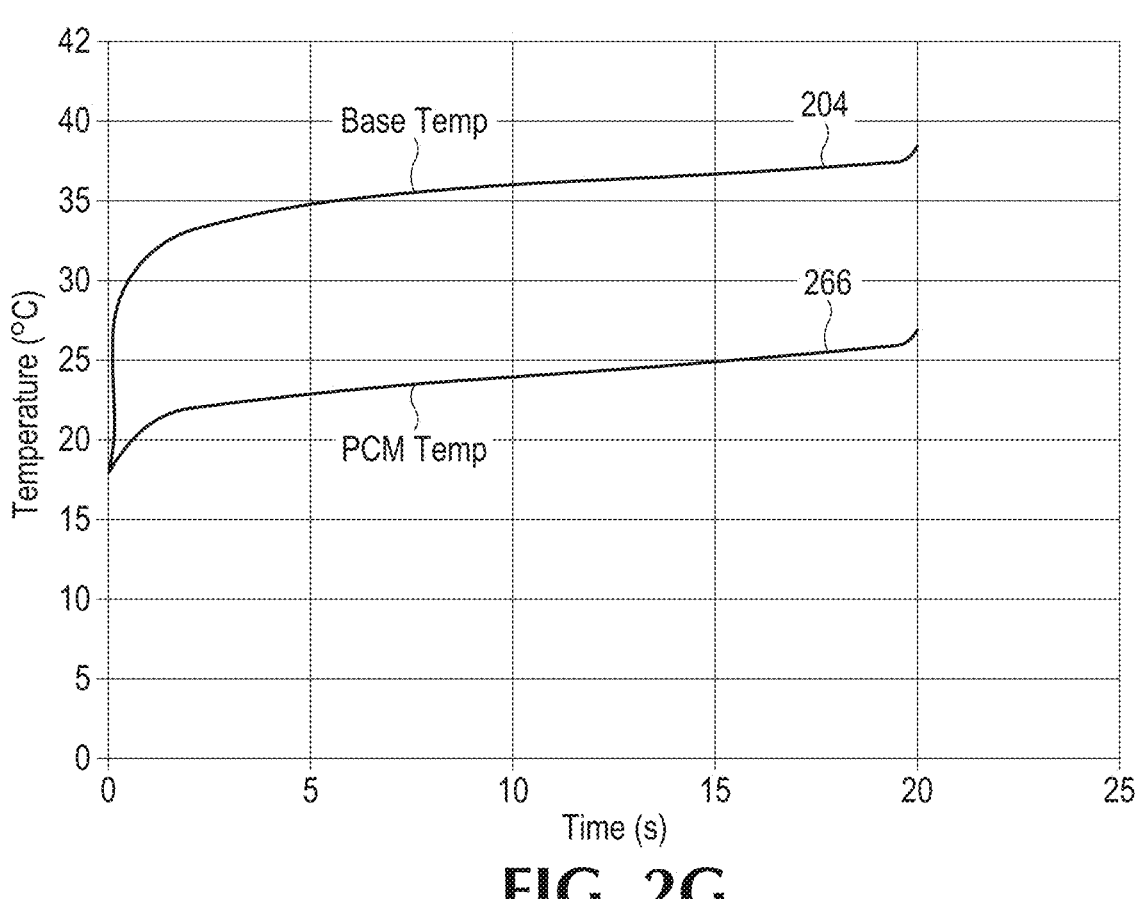
FIG. 2G is a graph depicting temperature of PCM and base versus time.

FIG. 2G is a graph depicting temp v. time of PCM 266 and base 204 where PCM is paraffin. Given the relatively high heat flux into the PCM (~7 W/cm²), in a particular example, the space between the fins should be narrow to allow the heat to be transferred into the PCM 266 over a 20-30 second operational period. Here the fins 266 are 0.005" thick with 0.007" of PCM between them. Thus, in this example there is a heat transfer coefficient of 6500 W/m²-K with a reference temperature of 25° C.

In an example, rather than a vapor chamber 208, a plurality of heat pipes 308 may form a heat transfer portion of an integrated thermal management assembly 302.

Figure 3A:
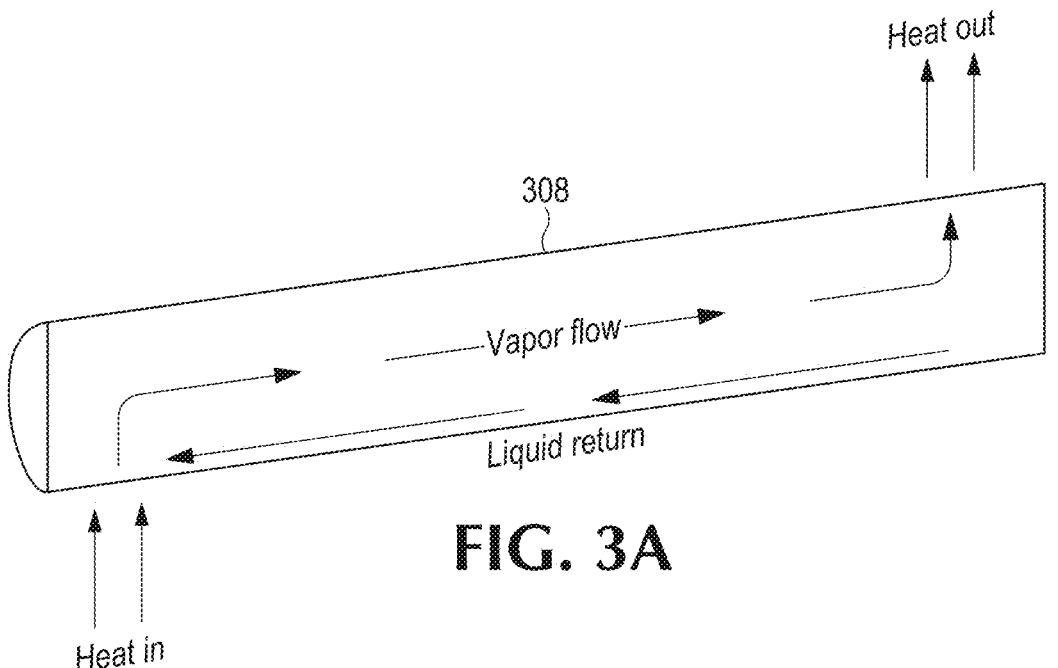
FIG. 3A illustrates a cutaway of an example heat pipe configured to remove heat from a heat source and transfer the heat to heat sink such as fins and/or PCM material.

FIG. 3A illustrates a cross-section of an example heat pipe 308 configured to remove heat from a heat source and transfer the heat to heat sink such as fins and/or PCM material. The conductivity of the vapor flow and liquid return in heat pipe 308 represents the heat transfer that is occurring as the PCM boils and re-condenses in the heat pipe.

Figure 3B:
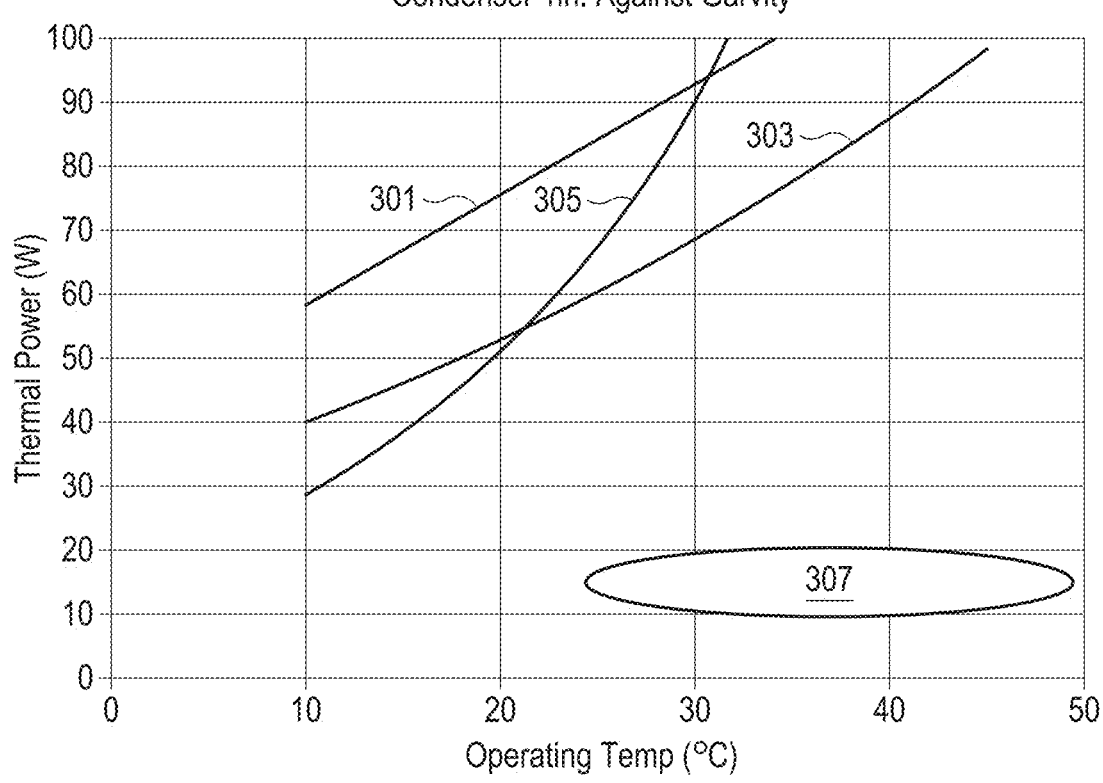
FIG. 3B is a plot showing thermal power dissipation vs operating temperature for determining capillary limit of a heat pipe.

The limits of the heat pipe 308 can be calculated to ensure that they will not dry out at the operating temperature and power. FIG. 3B is a plot showing thermal power dissipation vs operating temperature for the capillary limit (red curve 301), entrainment limit (blue curve 303) and sonic limit (yellow curve 305). The capillary limit is typically the parameter that limits a heat pipes maximum power. This occurs when the wick cannot pump enough liquid back to the heated area. Heat pipe design should be below the capillary limit. The critical heat flux of the heat pipes 308 should be considered in order to optimize performance. This occurs when the boiling in the heated area changes from a very efficient nucleate boiling to a film type boiling regime. The temperature gradient of the pipe increases dramatically when this occurs. In some examples, the oval 307 may be an estimated operating range for laser diode packaging applications.

Figure 3C:
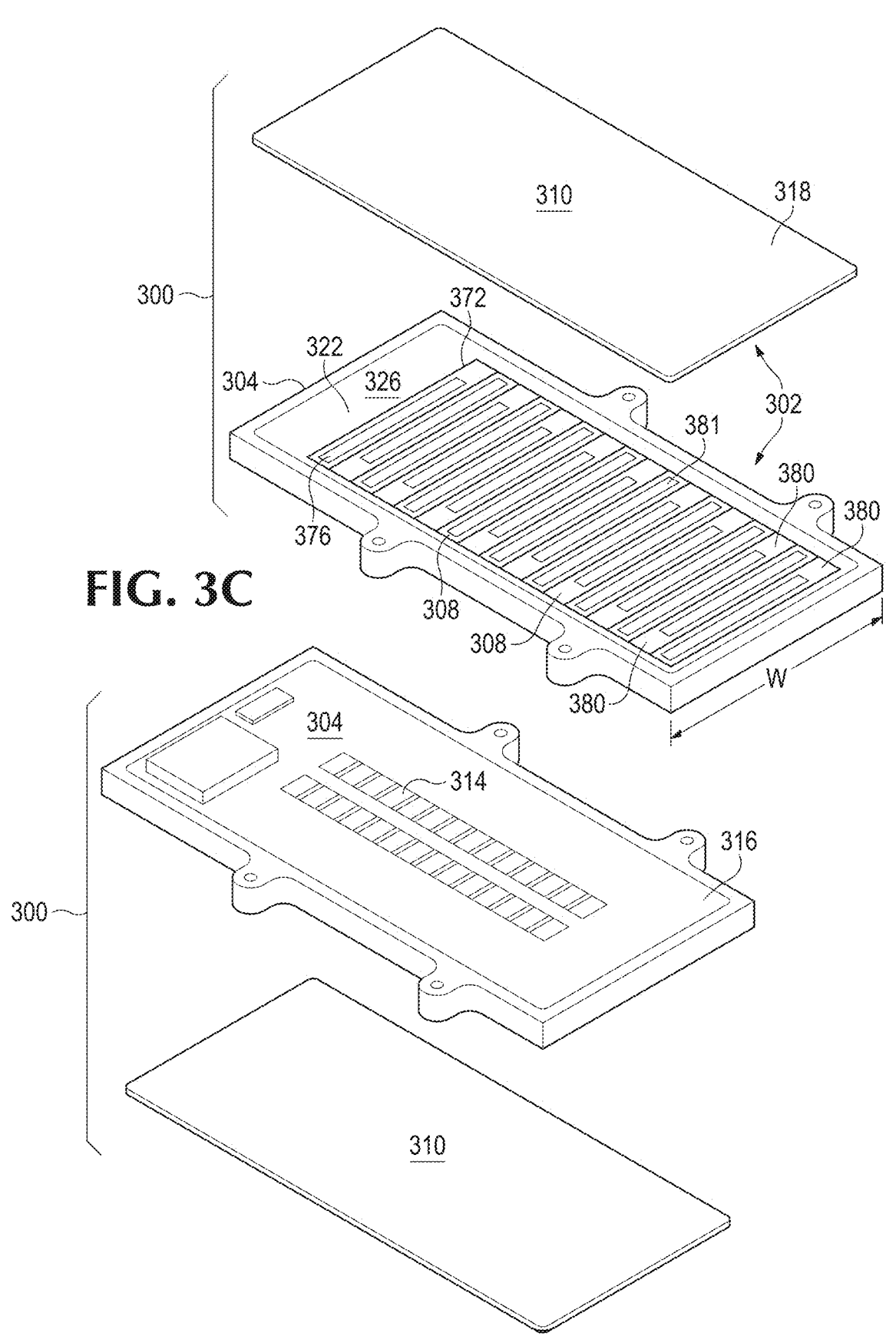
FIG. 3C is an exploded view of an example low SWaP fiber-coupled diode laser package with an integrated thermal management assembly.

FIG. 3C is an exploded view of an example low SWaP fiber-coupled diode laser package 300 with lid 310 side up (390 shows lid 310 side down) with integrated thermal management assembly 302. Package 300 includes a base portion 304. Base portion 304 may be made of a thermally conductive material. In an example, integrated thermal management assembly 302 comprises one or more heat pipes 308 disposed on an inner surface 326 of base 304 lining inner cavity 322. A PCM in heat pipes 308 may be any of a variety of PCMs for such an application known to those of skill in the art, such as, for example, acetone, ammonia, ethane, methanol, methylamine, pentane, propylene, or the like, or any combinations thereof. The heat pipes may be fabricated to fit across an entire width, W, of cavity 322 in base 304. Fill tube ends 380 are the regions inside each of the heat pipes 308 that is not effective in wicking due to a process used for pinching off the fill tube end 380. Heat pipes 308 are arranged such that fill tube ends 380 are alternated with vapor chamber ends 381 to reduce the impact of the inactive portion of the heat pipes 308 on heat transfer across base 304.

Lid 310 may be bonded to base 304 to form void 322. Thermal interface material may be applied in gaps around heat pipes 308, for example between heat pipes 308 or between heat pipes 308 and lid 310. Heat pipes 308 may be disposed in grooves 382 formed in base 304 (see FIG. 3D) to improve dissipation of the heat generated by laser diodes 314 disposed on surface 316 to a cooled surface 318. Laser diodes 314 are thermally coupled to the PCM through base 304. The PCM may comprise any of a variety of PCM's known to those of skill in the art such as water, alcohol, acetone or the like, or any combinations thereof.

Figure 3D:
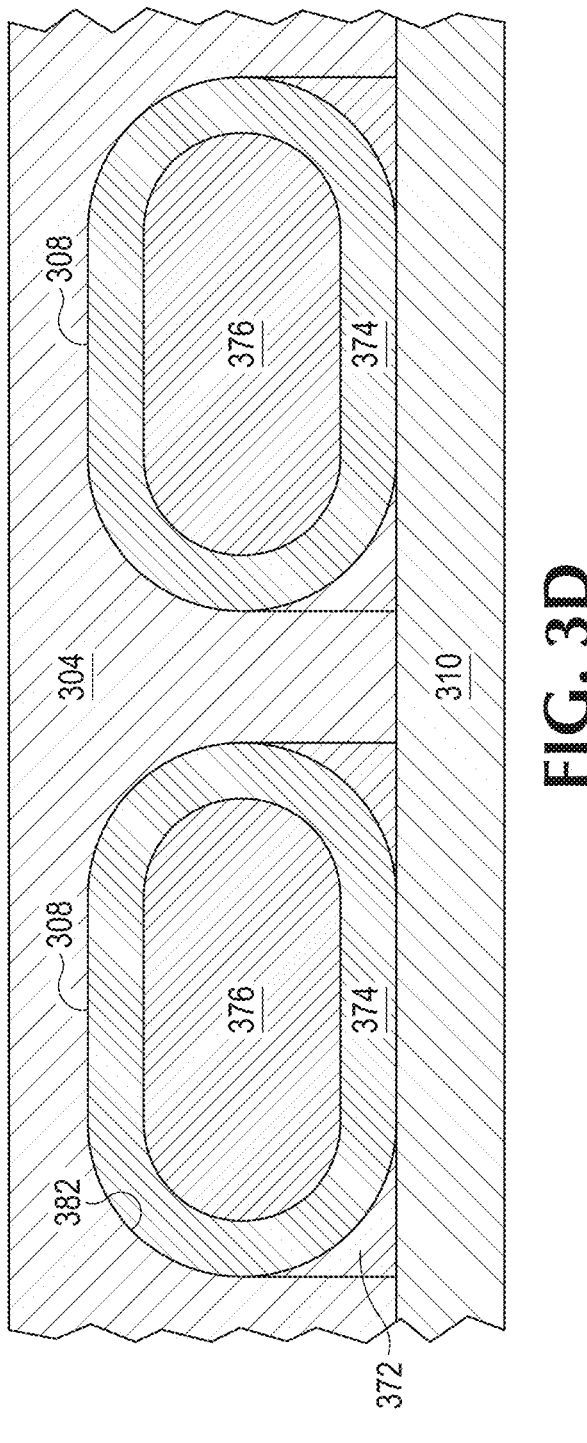
FIG. 3D illustrates a cross-section of example heat pipes coupled to a base and/or lid with a thermal interface material.

FIG. 3D illustrates a cross-section of heat pipes 308 coupled to base 304 and/or lid 310 with a thermal interface material 372 which could also be in the form of metal solder used to attach heat pipes 308 to the lid 310. Heat pipe envelope 374 surrounds vapor cavity 376 within which a PCM upon exposure to heat from laser diodes 314 boils to vapor. The vapor moves within heat pipe 308 through convection and transfers heat away from base 304 to lid 310 through condensation.

Figure 3E:
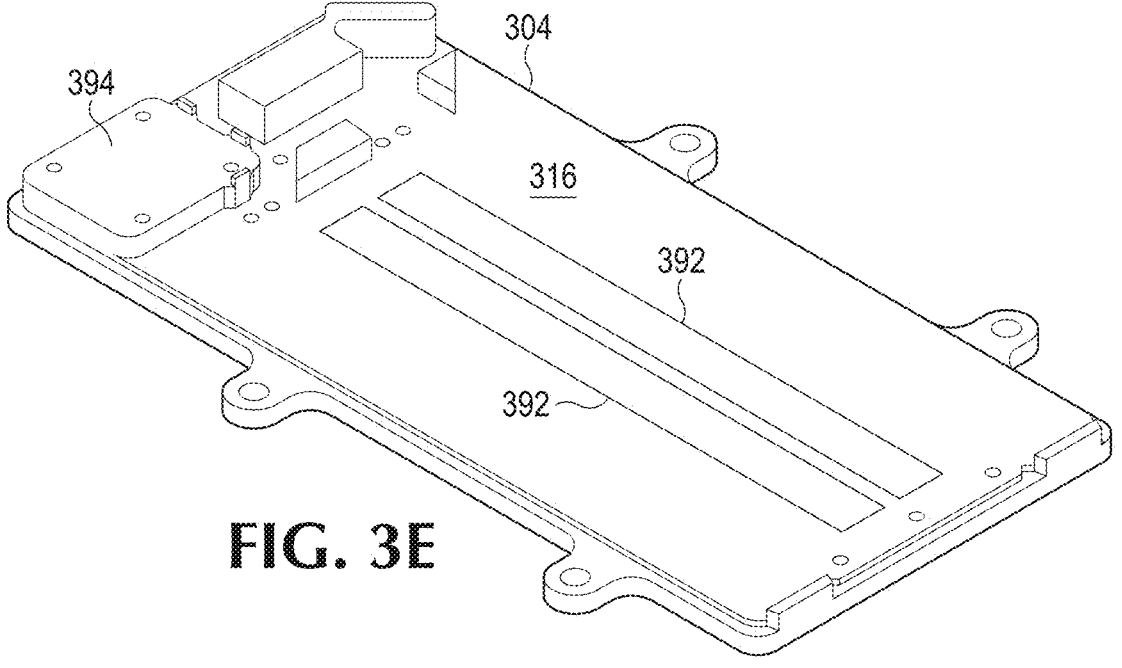
FIG. 3E illustrates heat loads in example laser diode packaging used for modeling.

FIG. 3E, illustrates an example of heat loads generated by components in laser package 300 on a top surface 316 of base 304 (see FIG. 3C). These heat loads are the basis for modeling depicted in FIGS. 4-7. In an example, laser diodes 314 are arranged into rows that may each generate a 250 W (392) heat load. A fiber end receptacle 394 where laser beams are coupled into the end of a fiber may generate a 70 W (394) heat load. A heat transfer coefficient of 6500 W/m²-K was used with a reference temperature of 25° C. An aluminum PCM heat sink was assumed. The input heat flux is typically ≥40 W/cm2 under the 250 W laser diode 314 sources FIGS. 3F-3I illustrate plan views of heat pipes 308 disposed on base 304 in various layouts to optimize heat dissipation to an outer surface 318 of lid 310. In an example, an additional heat sink may be coupled to surface 318 as described with reference to heat sink 262 in FIG. 2E.

Figures 3F, 3G, 3H, 3I:
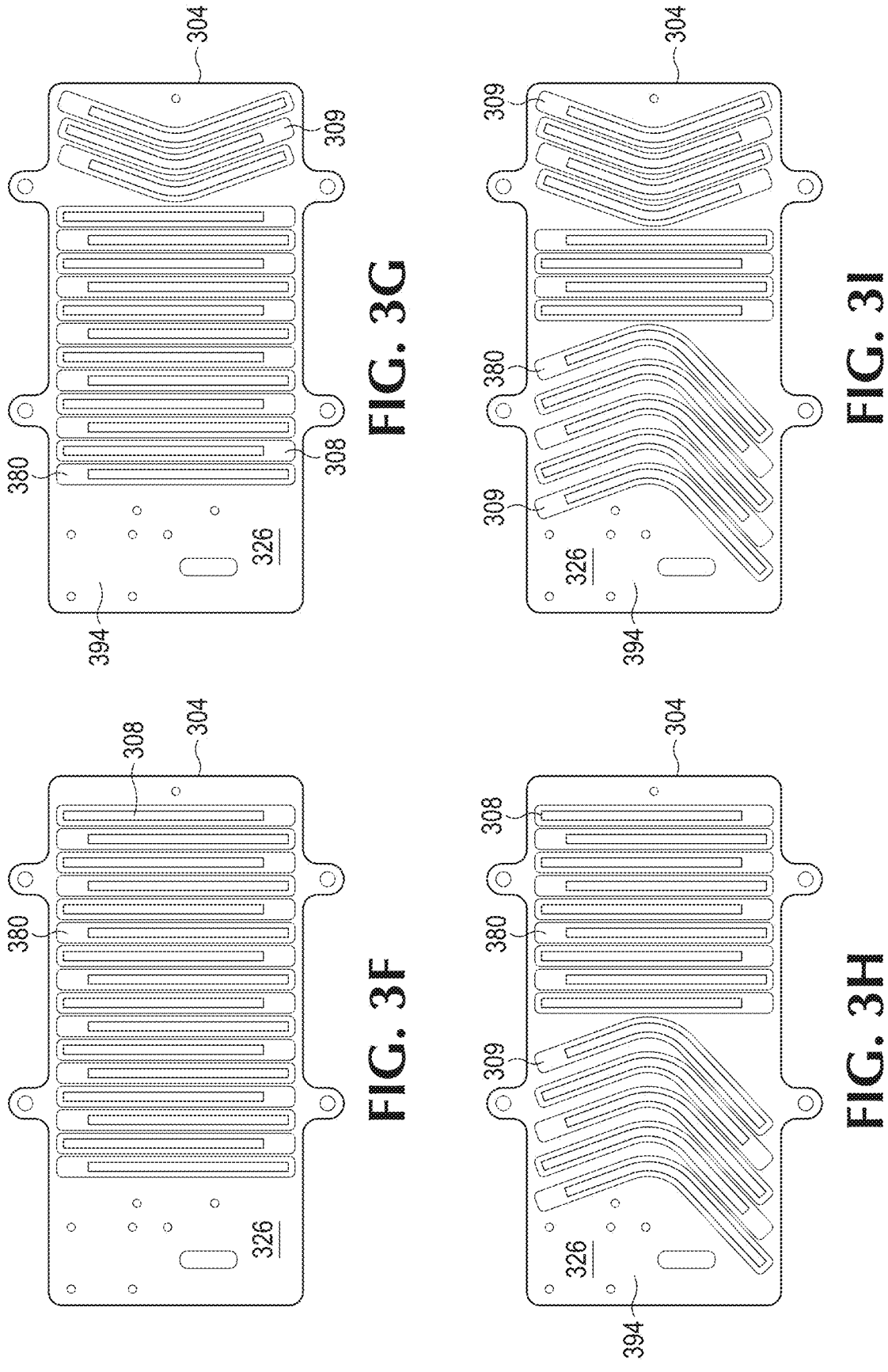
FIGS. 3F-3I illustrate plan views of heat pipes disposed on base in various layouts to optimize heat spreading to a lid in a low SWaP fiber-coupled diode laser package.

FIG. 3F depicts a first heat pipe layout with heat pipes 308 disposed on surface 326 of base 304 wherein all of the heat pipes 308 are straight with alternating fill tube ends 380.

FIG. 3G depicts a second heat pipe layout with heat pipes 308/309 disposed on surface 326 of base 304 having bent heat pipes 309 on an end opposite a heat source 394 (position of input fiber for receiving n laser beams generated by laser diodes 314) of base 304 and straight heat pipes 308 disposed in the rest of the base 304. Fill tube ends 380 are alternated with vapor cavity ends of pipe 308.

FIG. 3H depicts a third heat pipe layout with heat pipes 308/309 disposed on surface 326 of base 304 having bent heat pipes 309 on an end adjacent to a heat source 394 of base 304 and straight heat pipes 308 disposed in the rest of the base 304. Fill tube ends 380 are alternated.

FIG. 3I depicts a third heat pipe layout with heat pipes 308/309 disposed on surface 326 of base 304 having bent heat pipes 309 on an both ends of base 304 and straight heat pipes 308 disposed between bent heat pipes 309. Fill tube ends 380 are alternated in this design.

FIGS. 4-7 illustrate thermal simulations of various the heat pipe layouts shown in FIGS. 3F-3I based on sample heat loads described above with respect to FIG. 3E.

Figure 4:
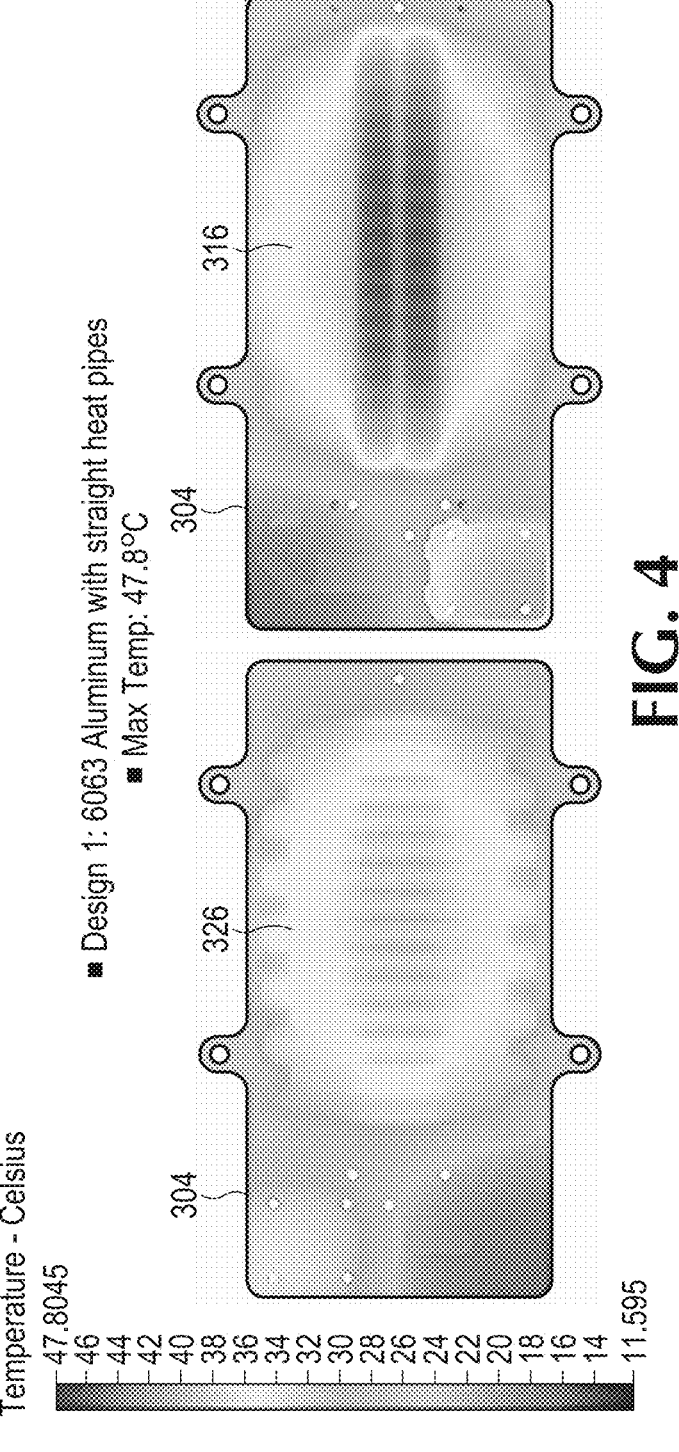
FIGS. 4-7 illustrate thermal modeling of various heat pipe layouts shown in FIGS. 3F-3I.
Figure 5:
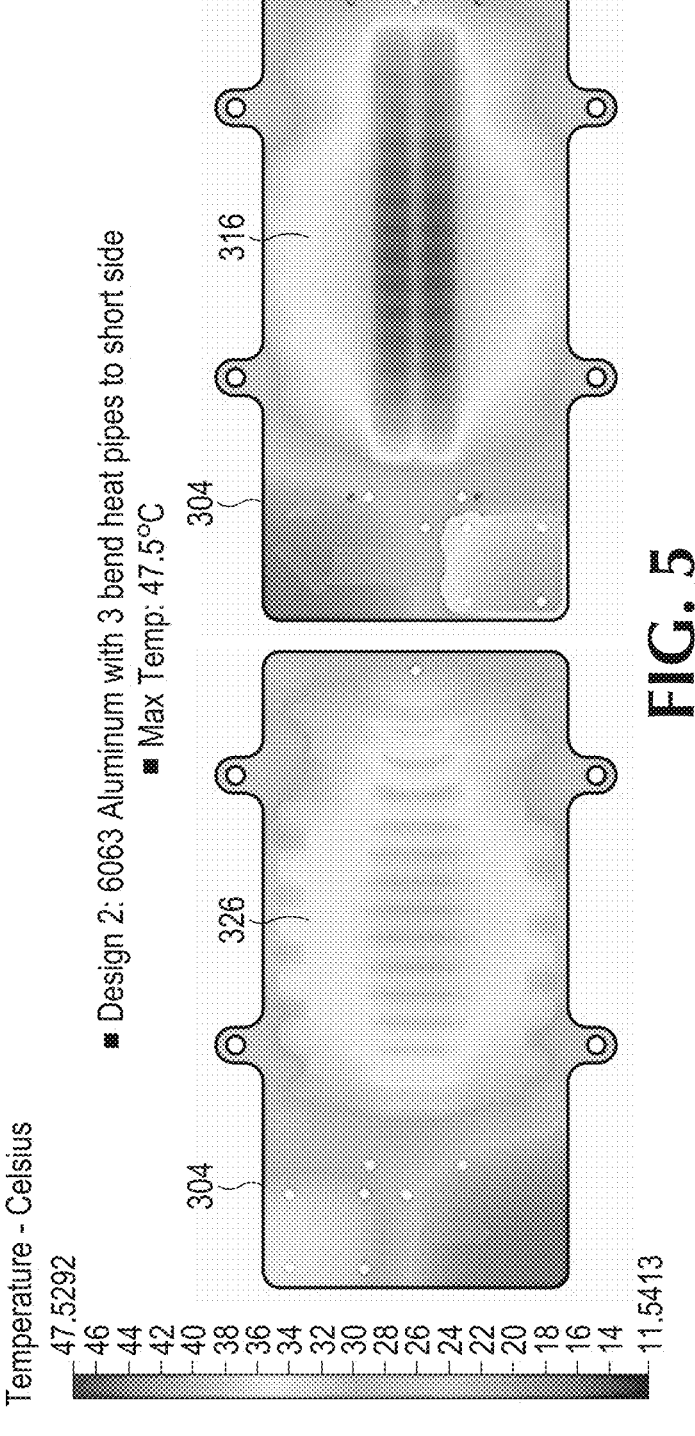
Figure 6:
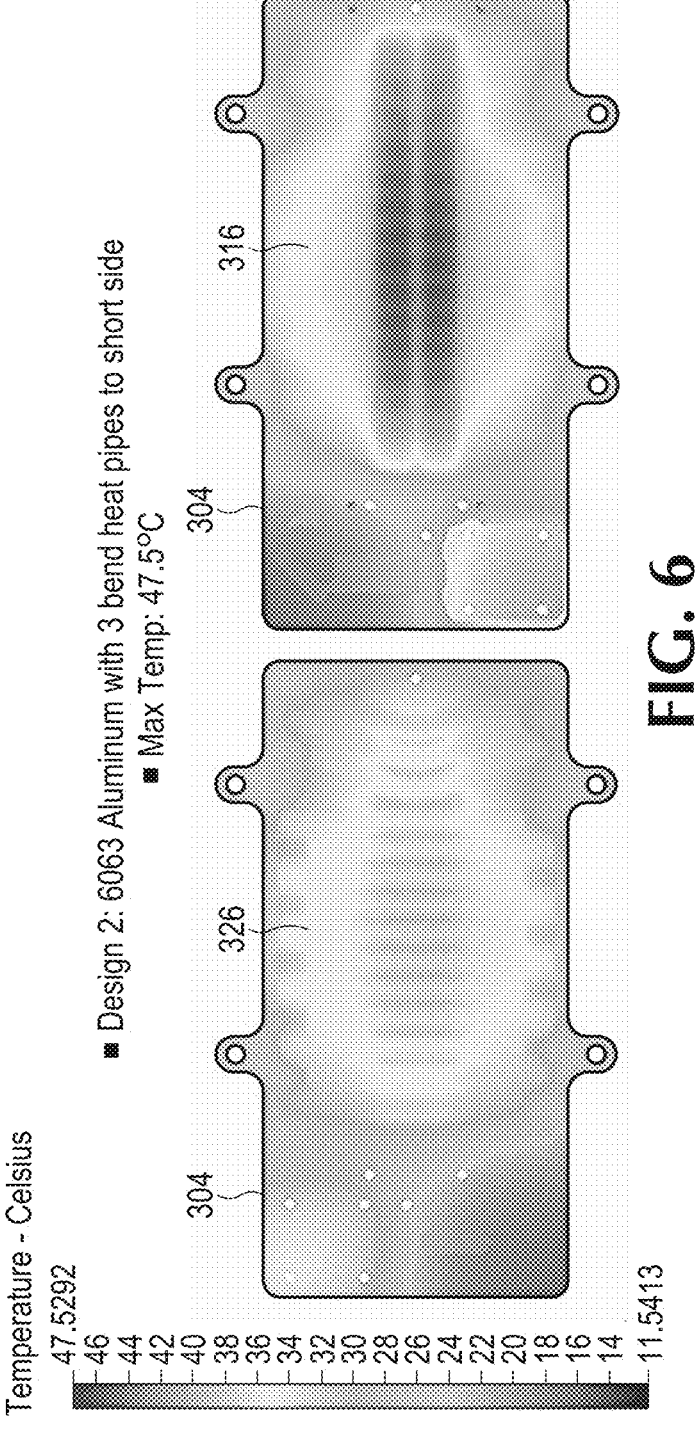
Figure 7:
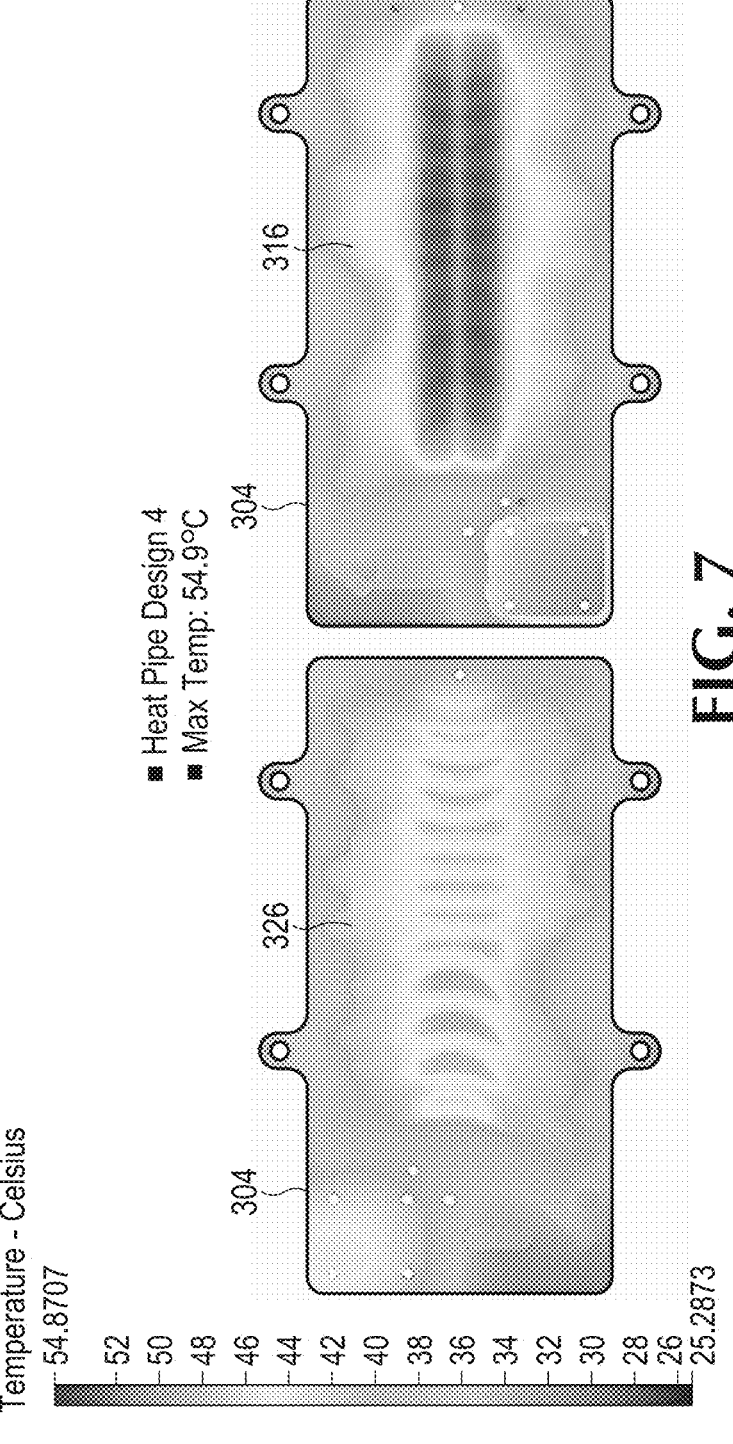

FIG. 4 depicts a thermal model of the first heat pipe layout shown in FIG. 3F. FIG. 5 depicts a thermal model of the second heat pipe layout shown in FIG. 3G. FIG. 6 depicts a thermal model of the third heat pipe layout shown in FIG. 3H. FIG. 7 depicts a thermal model of the fourth heat pipe layout shown in FIG. 3I. The simulations show that heat generated by laser diodes 314 on top side 316 of base 304 is efficiently dissipated through inner surface 326 of base 304 by heat pipes 308 such that heat is drawn to lid 310 from top side 316 and spread substantially evenly across base 304 in each example. The heat flux into the heat pipes was measured at 22 W/cm². The critical heat flux at the operating temp is ~46 W/cm². Adding in the bent heat pipes to better utilize the area reduced the max temperature by ~2° C. The results are provided in Table 1:

8

TABLE 1

| Plate Material | HP Design | Max Temp |
|---|---|---|
| 6063 Al | No | 64.0° C. |
| 6063 Al | 1 | 56.3° C. |
| 6063 Al | 2 | 57.0° C. |
| 6063 Al | 3 | 55.9° C. |
| 6063 Al | 4 | 54.9° C. |

Having described and illustrated the general and specific principles of examples of integrated heat spreaders for low-SWaP fiber-coupled diode laser applications it should be apparent that the examples may be modified in arrangement and detail without departing from such principles. We claim all modifications and variation coming within the spirit and scope of the following claims.

The invention claimed is:

1. A laser diode package, comprising:
a housing having a metal base portion;
an integrated heat spreader formed within the base portion, the integrated heat spreader comprising a first phase-change material (PCM) and configured to dissipate heat via phase-change cooling;
a heat source disposed on a top surface of the base portion, the heat source thermally coupled to the integrated heat spreader so as to dissipate heat away from the heat source via phase-change cooling; and
a plurality of heat pipes disposed in the integrated heat spreader,
wherein the plurality of heat pipes contain the first PCM,
wherein each of the plurality of heat pipes comprise respective fill tube ends and respective vapor cavity ends,
wherein at least a portion of the respective fill tubes ends are inactive portions of the plurality of heat pipes,
wherein the plurality of heat pipes are arranged lengthwise across a width of the base portion in a side-by-side arrangement,
wherein respective fill tube ends alternate with respective vapor cavity ends,
wherein the first PCM is permitted to boil and condense within the plurality of heat pipes, and
wherein each of the plurality of heat pipes transfers heat, via the first PCM, independently of each other one of the plurality of heat pipes.

2. The laser diode package of claim 1, wherein the first PCM comprises at least one of acetone, ammonia, ethane, methanol, methylamine, pentane, and propylene.

3. The laser diode package of claim 1, wherein one or more of the plurality of heat pipes is bent.

4. The laser diode package of claim 1, wherein the first PCM is water, alcohol or acetone, or a combination thereof.

5. The laser diode package of claim 1, further comprising:
a lid fabricated to couple to the metal base portion; and
a heatsink coupled to a top surface of the lid.

6. The laser diode package of claim 5, wherein the heatsink comprises fins.

7. The laser diode package of claim 6, wherein the heatsink comprises a second PCM.

8. The laser diode package of claim 7, wherein the integrated heat spreader is a vapor chamber.

9. The laser diode package of claim 7, wherein the integrated heat spreader comprises the plurality of heat pipes.

10. The laser diode package of claim 7, wherein the first PCM is water, alcohol or acetone and wherein the second PCM is paraffin.

11. The laser diode housing of claim 1, wherein the heat source is one or more laser diodes.

12. The laser diode package of claim 1, wherein each of the plurality of heat pipes are sealed.

* * * * *